US011024652B2

(12) United States Patent
Nam et al.

(10) Patent No.: US 11,024,652 B2
(45) Date of Patent: Jun. 1, 2021

(54) FLEXIBLE DISPLAY DEVICE AND METHOD OF MANUFACTURING THE SAME

(71) Applicant: LG DISPLAY CO., LTD., Seoul (KR)

(72) Inventors: Boae Nam, Paju-si (KR); JungHan Kim, Seoul (KR); KilSuk Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/565,025

(22) Filed: Dec. 9, 2014

(65) Prior Publication Data

US 2016/0043109 A1 Feb. 11, 2016

(30) Foreign Application Priority Data

Aug. 5, 2014 (KR) .................. 10-2014-0100372

(51) Int. Cl.
*H01L 27/12* (2006.01)
*H01L 51/00* (2006.01)
*H01L 27/32* (2006.01)
*H01L 21/3205* (2006.01)
*H01L 23/538* (2006.01)
(Continued)

(52) U.S. Cl.
CPC .... *H01L 27/1218* (2013.01); *H01L 21/32056* (2013.01); *H01L 23/5387* (2013.01); *H01L 27/124* (2013.01); *H01L 27/1225* (2013.01); *H01L 27/1262* (2013.01); *H01L 27/3276* (2013.01); *H01L 29/45* (2013.01); *H01L 29/4966* (2013.01); *H01L 51/0097* (2013.01); *H01L 27/3262* (2013.01); *H01L 2924/0002* (2013.01); *Y02E 10/549* (2013.01); *Y02P 70/50* (2015.11)

(58) Field of Classification Search
None
See application file for complete search history.

(56) References Cited

U.S. PATENT DOCUMENTS 9,373,515 B2 * 6/2016 Markovich ..... H01L 31/022466
2009/0052029 A1 2/2009 Dai et al.
(Continued)

FOREIGN PATENT DOCUMENTS

CN 1745301 A 3/2006
CN 101589473 A 11/2009
(Continued)

*Primary Examiner* — Abul Kalam
(74) *Attorney, Agent, or Firm* — Birch, Stewart, Kolasch & Birch, LLP

(57) ABSTRACT

A flexible display device is discussed. The flexible display device includes a substrate having multiple signal lines arranged on the substrate; a transistor disposed on the substrate, the transistor including a gate electrode, a source electrode, and a drain electrode; and a second electrode disposed to correspond to a first electrode connected to the source electrode or the drain electrode of the transistor, wherein at least one of the multiple signal lines, the gate electrode, the source electrode, the drain electrode, and the second electrode is formed of a conductor having a metal nanowire structure and a polymer substance, the metal nonwire structure being disposed in the polymer substance. Also discussed is a method of manufacturing the flexible display device.

20 Claims, 12 Drawing Sheets

(51) Int. Cl.
*H01L 29/45* (2006.01)
*H01L 29/49* (2006.01)

(56) References Cited

U.S. PATENT DOCUMENTS

| | | | |
|---|---|---|---|
| 2009/0056854 A1 | 3/2009 | Oh et al. | |
| 2010/0221455 A1* | 9/2010 | Kim | C09D 4/00 428/1.1 |
| 2010/0243295 A1* | 9/2010 | Allemand | B82Y 10/00 174/250 |
| 2010/0255323 A1* | 10/2010 | Nakamura | H01B 1/22 428/457 |
| 2010/0266956 A1* | 10/2010 | Naoi | G03F 7/0047 430/285.1 |
| 2011/0007042 A1 | 1/2011 | Miyaguchi | |
| 2012/0127097 A1* | 5/2012 | Gaynor | B82Y 20/00 345/173 |
| 2014/0203223 A1* | 7/2014 | Ikada | B32B 15/08 252/514 |
| 2015/0009432 A1* | 1/2015 | Katagiri | G06F 3/041 349/12 |
| 2015/0049409 A1* | 2/2015 | Choi | H01J 11/44 361/220 |
| 2015/0372235 A1* | 12/2015 | Noh | H01L 51/0019 257/40 |

FOREIGN PATENT DOCUMENTS

| | | |
|---|---|---|
| JP | 2006-13480 A | 1/2006 |
| JP | 2009-251274 A | 10/2009 |
| JP | 2011-34066 A | 2/2011 |
| JP | 2012-209232 A | 10/2012 |
| JP | 2013-45063 A | 3/2013 |
| JP | 2013-195969 A | 9/2013 |
| JP | 2014-13820 A | 1/2014 |
| JP | 2014-115739 A | 6/2014 |
| KR | 10-2009-0112626 A | 10/2009 |
| KR | 10-2010-0108984 A | 10/2010 |

* cited by examiner

FIG. 7B

|  | STRAIN 1.5% (R=4.5) | |
| --- | --- | --- |
|  | RESISTANCE | RATIO OF INCREASE |
| INITIAL RESISTANCE | 4.0 | – |
| 50,000 CYCLE | 4.1 | 2.5% |
| 100,000 CYCLE | 4.1 | 2.5% |
| 200,000 CYCLE | 4.2 | 5% |

FLEXIBLE DISPLAY DEVICE AND METHOD OF MANUFACTURING THE SAME

CROSS-REFERENCE TO RELATED APPLICATION

This application claims priority from and the benefit under 35 U.S.C. § 119(a) of Korean Patent Application No. 10-2014-0100372, filed on Aug. 5, 2014, which is hereby incorporated by reference for all purposes as if fully set forth herein.

BACKGROUND OF THE INVENTION

1. Field of the Invention

The embodiments of the invention relate to a flexible display device and a method of manufacturing the same.

2. Description of the Related Art

With the development of information society, various types of requirements for a display device for displaying an image are increasing and, recently, various display devices, such as a Liquid Crystal Display (LCD), a Plasma Display Panel (PDP), and an Organic Light Emitting Diode Display Device (OLED), are being used.

Recently, conventional glass substrates, which lack flexibility, have rapidly been replaced by flexible display devices or folding display devices, which use flexible materials (e.g. plastic) so that, even when bent like paper, they can maintain their display performance.

Such a flexible display device has a problem in that, since it is repeatedly bent and folded by an external force, the adhesiveness of its metal pattern (e.g. wiring), electric conductivity, uniformity of the surface, durability, reliability and the like may degrade.

SUMMARY OF THE INVENTION

An aspect of the embodiments of the invention is to provide a display device which improves the adhesiveness of its conductor (e.g. wiring), electric conductivity, surface uniformity, durability, and realiability and which reduces manufacturing costs.

In accordance with an aspect of the embodiments of the invention, there is provided a flexible display device including: a substrate having multiple signal lines arranged on the substrate; a transistor disposed on the substrate, the transistor including a gate electrode, a source electrode, and a drain electrode; and a second electrode disposed to correspond to a first electrode connected to the source electrode or the drain electrode of the transistor.

In the flexible display device, at least one of the multiple signal lines, the gate electrode, the source electrode, the drain electrode, and the second electrode, which are formed on the substrate, may be implemented as a conductor including a metal nanowire structure and a polymer substance, the metal nanowire structure being disposed in the polymer substance.

In accordance with another aspect of the embodiments of the invention, there is provided a method of manufacturing a flexible display device, the method including: disposing a polymer substance having adhesiveness on a substrate or an insulation film positioned on the substrate; disposing multiple metal nanowires onto the polymer substance; and forming a conductor including a metal nanowire structure and the polymer substance by cross-connecting the multiple metal nanowires to each other so that the metal nanowire structure is formed into the polymer substance.

In accordance with another aspect of the embodiments of the invention, there is provided a flexible display device including: a substrate; and a conductor positioned on the substrate, the conductor including a metal nanowire structure and a polymer substance, the metal nanowire structure being disposed in the polymer substance.

The conductor may be at least one of a source electrode, a drain electrode, and a gate electrode of a transistor disposed on the substrate, and a signal line and a common electrode disposed on the substrate. The polymer substance may be made of the same substance as the substrate.

The embodiments of the invention are advantageous in that it improves the strength of attachment of the conductor (e.g. wiring), electric conductivity, surface uniformity, durability, and realiability and reduces the manufacturing cost.

BRIEF DESCRIPTION OF THE DRAWINGS

The above and other objects, features and advantages of the embodiments of the invention will be more apparent from the following detailed description taken in conjunction with the accompanying drawings, in which:

FIG. 7B is a table corresponding to the graph of FIG. 7A.

DETAILED DESCRIPTION OF THE EMBODIMENTS

Figure 1:
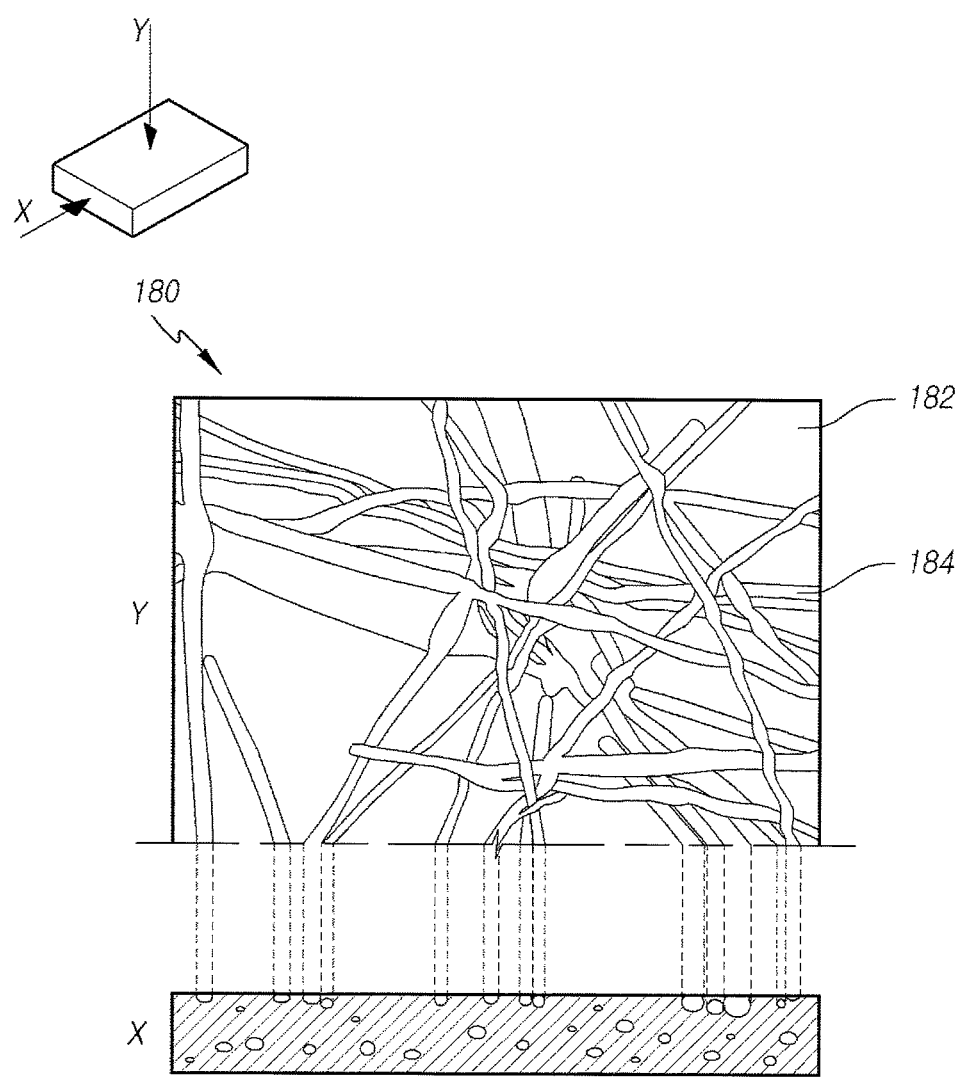
FIG. 1 is a schematic perspective view illustrating a part of a conductor formed on a flexible display device according to embodiments of the invention.

Hereinafter, example embodiments of the invention will be described in detail with reference to the accompanying drawings. In the following description, the same elements will be designated by the same reference numerals throughout even they are shown in different drawings. Further, in the following description of embodiments of the invention, a detailed description of known functions and configurations incorporated herein will be omitted when it is deemed that redundant detailed descriptions obscures the subject matter of the embodiments of the invention.

In addition, terms, such as first, second, A, B, (a), (b) or the like may be used herein when describing components of the embodiments of the invention. These terms are merely used to distinguish one structural element from other structural elements, and a property, an order, a sequence and the like of a corresponding structural element are not limited by the term. It should be noted that if it is described in the specification that one component is "connected," "coupled"

or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a schematic sectional and top view illustrating a part of a conductor formed on a flexible display device according to embodiments of the invention.

FIG. 1 illustrates an x-direction section view and a y-direction top view of a part of a conductor 180 and, referring to FIG. 1, the conductor 180 may include a polymer substance 182 having adhesiveness and a metal nanowire structure 184 inserted into the polymer substance 182. The metal nanowire structure 184 includes multiple metal nanowires cross-connected to each other. The metal nanowire structure 184 may be a silver nanowire structure, but is not limited thereto.

The metal nanowires generally refer to conductive nano-sized structures, at least one of which may have a dimension (i.e. width or diameter) of less than 500 nm, e.g. less than 100 nm or 50 nm, but the dimension is not limited thereto.

The nanostructures may be made of any conductive material. For example, the metal nanowires may be made of a metallic material including elemental metal (e.g. transition metals) or a metal compound (e.g. metal oxide). The metallic material may be a bimetal material including at least two types of metals or a metal alloy. Suitable metals include silver, gold, copper, nickel, plating silver, platinum, and palladium, but are not limited thereto. It is to be noted that, although the description is made in connection with silver nanowires, any substance can be used.

As illustrated in FIG. 1, the metal nanowire structure 184 is inserted into the polymer substance 182. In addition, the metal nanowire structure 184 is configured so that multiple metal nanowires are electrically connected to a different metal nanowire at at least one point.

This secures fatigue fracture reliability, i.e. the conductor 180, when included in a flexible display device, can endure repeated bending or folding. The cross connection structure of the metal nanowire structure 184 reduces the ratio of occurrence of cracks, under situations of repeated bending and folding, and secures excellent durability and reliability.

In addition, the coupling structure or interaction between the metal nanowire structure 184 and the polymer substance 182 improves the surface uniformity of the metal nanowire structure 184, advantageously making it unnecessary to stack a flattening layer for surface flattening. As a result, the thickness of the panel of the display device 200 as a whole can be reduced.

When the metal nanowire structure 184 is a silver nanowire structure, high electric conductivity of silver (Ag) secures a high level of conduction property. In addition, junction of multiple silver nanowires can minimize loss of conductivity even when any part of the nanowires is broken in the process of bending or folding.

The metal nanowire structure 184 may have a non-linear type that follows no rule. This is because coupling is made between metal nanowires irregularly in the process of bonding the nanowires. This will be described later in more detail.

Meanwhile, the polymer substance 182 may be made of a substance based on plastic having adhesiveness, such as polyimide, and may be, for example, a polyimide-based compound formed through reaction between at least one compound selected from the group consisting of ODA(4,4'-oxydianiline), BDSA(4,4'-diaminodiphenyl-2,2'-disulfonic acid), HFBAPP(2,2'-bis[4-(4-aminophenoxy)phenyl] hexafluoropropane), and AHHFP(2,2-bis(3-amino-4-hydroxyphenyl)hexafluoropropane) and at least one compound selected from the group consisting of BTDA(3,3'-4,4'-benzophenonetetracarboxylic dianhydride), TMA(trimellitic anhydride), and ODPA(4,4'-oxydiphthalic anhydride); and the polymer substance 182 may have a hydrophilic function group capable of improving adhesiveness through hydrogen bonding, but is not limited thereto.

The polyimide-based polymer substance 182 is advantageous in that it has adhesiveness and strong resistance to heat enough to prevent deformation or alteration during a heat-applied process, and provides the display device with flexibility.

Meanwhile, the polymer substance 182 may be made of the same substance as the substrate, which is the lower layer of the polymer substance 182, or as the insulation film, thereby improving adhesiveness with respect to the substrate or the insulation film. This can further improve the durability and reliability of the flexible display device.

In the instance of the conductor 180 applied to the flexible display device, the polymer substance 182 needs to have a low level of hardness, in order to cope with bending or folding.

The above description will now be summarized: in order to provide the flexible display device with flexibility, the conductor 180 inside the flexible display device is implemented by inserting a metal nanowire structure into a polymer substance having adhesiveness.

One of a source electrode, a drain electrode, and a gate electrode of a transistor formed on the substrate, a signal line formed on the substrate, a common electrode (e.g. common voltage electrode of a LCD, a cathode electrode of an OLED), and the like may be formed as the above-mentioned conductor 180.

In connection with the flexible display device, furthermore, when a touch screen panel (TSP) is attached to the display panel in add-on type or when a touch screen panel is embedded in the display panel in on-cell or in-cell type, the touch electrode, which may be formed on the touch screen panel or on the display panel incorporating the touch screen panel to be elongated in the transverse or longitudinal direction or to be a large block, may be formed as a conductor 180 of the above-mentioned structure, in order to provide the flexible display device with flexibility.

Besides this, a conductor 180 of the above-mentioned structure may be applied to any conductive pattern inside the flexible display device, in order to increase flexibility.

Hereinafter, a flexible OLED, which includes a conductor described with reference to FIG. 1, will be described. It is to be noted that such an assumption is solely for convenience of description, and embodiments of the invention can be applied not only to OLEDs, but also to other flexible display devices such as flexible LCDs.

Figure 2:
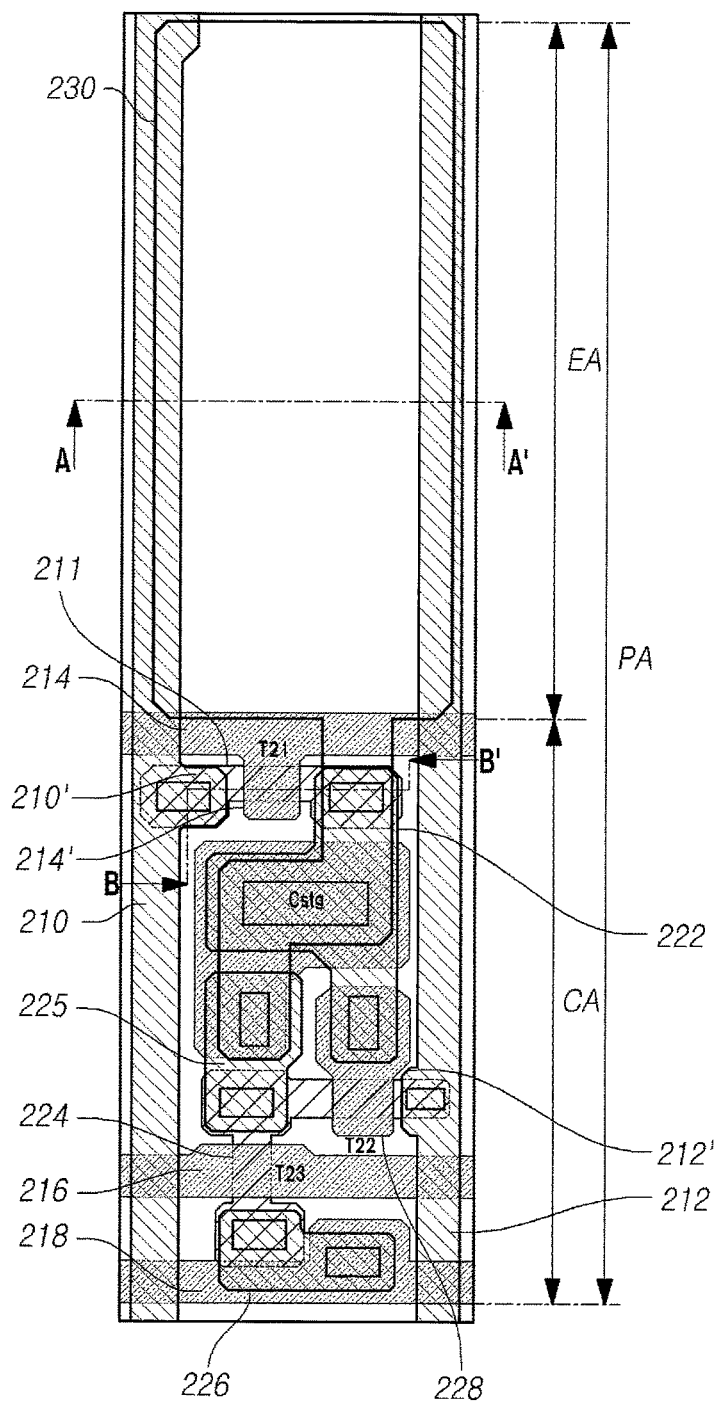
FIG. 2 is a schematic top view of a flexible OLED according to an embodiment of the invention.

FIG. 2 is a schematic top view of a flexible OLED according to an embodiment of the invention.

Referring to FIG. 2, the OLED 200 may include a substrate having multiple signal lines 210, 212, 214, 216, 218 arranged thereon; transistors T21, T22, T23 formed on the substrate, the transistors including gate electrodes 214', 216, 228, source electrodes 210', 212', 226, and drain electrodes 222, 225; and a second electrode formed to correspond to a first electrode 230 connected to the source electrodes 210', 212', 226 or the drain electrodes 222, 225 of the transistors T21, T22, T23.

The flexible OLED 200 may adopt a top emission scheme or a bottom emission scheme.

Specifically, the substrate is composed of multiple pixel areas PAs, each of which is composed of an emission area EA and a circuit area CA.

Multiple pixel areas PAs exist, and each circuit area CA includes three transistors T21, T22, T23, first to fifth lines 210, 212, 214, 216, 218, a storage capacitor Cstg, and the like. The emission area EA of each pixel area PA may include a first line 210, a second line 212, a pixel electrode 230, and a bank overlapping with the peripheral area of the emission area EA.

The first transistor T21 may be a switching transistor, and includes a first source electrode 210', a first drain electrode 222, a first semiconductor layer 211, and a first gate 214'; one end of the first transistor T21 is connected to the storage capacitor Cstg, and the other end thereof is connected to the first line 210.

The second transistor T22 may be a driving transistor, and includes a second source electrode 212', a second drain electrode 225, and a second gate 228; one end of the second transistor T22 is connected to the second line 212, and the other end thereof is connected to the first transistor T21.

The third transistor T23 may be a sensing transistor, and includes a third source electrode 226, a third drain electrode 225, and a third gate 216; the third drain electrode 225 is connected to a node between the second transistor T22 and the pixel electrode 230; and the third source electrode 226 is connected to the fifth line 218.

The first line 210 may be a data line, and the second line 212 may be a voltage line (VDD line) for supplying high-voltage power. The third line 214 may be a first scan line, the fourth line 216 may be a second scan line, and the fifth line 218 may be a reference voltage line, but their configurations are not limited thereto.

The OLED 200 includes a pixel electrode 260, a common electrode, and at least one organic layer in an emission area EA, which is defined by intersection between the first line 210 and the third line 220, and emits light in response to a current supplied from the first transistor T21 formed on the substrate.

In this instance, at least one of the multiple signal lines 210, 212, 214, 216, 218, the gate electrodes 214', 216, 228, the source electrodes 210', 212', 226, the drain electrodes 222, 225, and the second electrode 236 may be a conductor 180, which has a metal nanowire structure 184 inserted into a polymer substance 182 having adhesiveness. The second electrode 236, on the other hand, may be made of a conductor 180 when the flexible OLED 200 adopts the bottom emission scheme. In the instance of the bottom emission scheme, emitted light is reflected by the second electrode 236 and is discharged in the direction of the first electrode 230.

The metal nanowire structure 184 may include multiple metal nanowires cross-connected to each other. The metal nanowire structure 184 may be a silver nanowire structure, but is not limited thereto.

In connection with the flexible OLED 200, the metal nanowire structure 184 and the polymer substance 182 integrally constitute the conductor 180. The polymer substance 182 may be a substance based on plastic having strong adhesiveness, such as polyimide.

Such a conductor 180 is advantageous in that it has strong adhesiveness and its surface is uniform, making it unnecessary to form a separate flattening layer.

At least one parts of the metal nanowire structure 184 intersect with each other and make an electric junction between them, and the metal nanowire structure 184 and the polymer substance 182 are firmly coupled to each other as an integral unit. Therefore, when the flexible display device 200 is repeatedly folded or bent, the conductor 180 can play the role of improving durability and reliability. This will be described later in more detail.

Meanwhile, the conductor 180 may include a photosensitive substance, which may be a photo acryl-based substance, for example, but is not limited thereto. Such a photosensitive substance has a process-related advantage in that, when the conductor 180 is patterned, the number of processes is reduced, thereby decreasing the manufacturing costs. This will be described later in connection with FIG. 5A to FIG. 5E.

Figure 3:
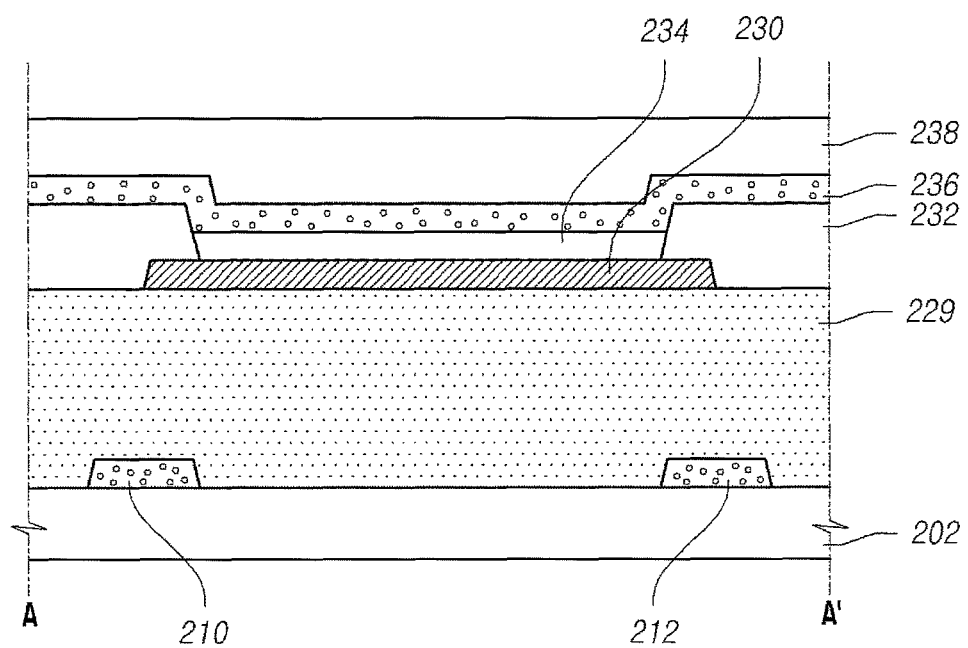
FIG. 3 is a sectional view taken along A-A' of the flexible OLED according to an embodiment of the invention of FIG. 2.

FIG. 3 is a sectional view taken along A-A' of the flexible OLED 200 of FIG. 2.

Referring to FIG. 3, the OLED 200 may include a first line 210 and a second line 212 formed on a substrate 202; a first insulation film 229 formed on the first line 210 and the second line 212; a first electrode 230 formed on the first insulation film 229; a bank 232 formed along the periphery of the first electrode 230; an organic layer 234 formed on a part of the first electrode 230 exposed by the bank 232; and a second electrode 236 formed to cover the organic layer 234 and the bank 232. A protection layer 238 may be formed on the second electrode 236 to protect the organic layer 234 from moisture and oxygen.

In this instance, at least one of the first line 210, the second line 212, and the second electrode 236 may be the above-mentioned conductor 180 including the the metal nanowire structure 184 and the polymer substance 182. Each metal nanowire structure 184 may be a silver nanowire structure, but is not limited thereto, and each may include different metals. The metal nanowire structure 184 is inserted into and firmly coupled to a polymer substance 182 having adhesiveness, and may also be firmly coupled to the substrate 202, the organic layer 234, and the bank 232, which are lower layers, by the polymer substance 182.

In this instance, the polymer substance 182 of the signal lines 210, 212 may be made of the same substance as the substrate 202. In other words, the first line 210 and the second line 212 may be made of the same substance as the substrate 202, thereby improving adhesiveness.

Specifically, the substrate 202 of the OLED 200 may be made of a substance based on plastic, such as polyimide, and may be, for example, a polyimide-based compound formed through reaction between at least one compound selected from the group consisting of ODA(4,4'-oxydianiline), BDSA(4,4'-diaminodiphenyl-2,2'-disulfonic acid), HFBAPP(2,2'-bis[4-(4-aminophenoxy)phenyl]hexafluoropropane), and AHHFP(2,2-bis(3-amino-4-hydroxyphenyl) hexafluoropropane) and at least one compound selected from the group consisting of BTDA(3,3'-4,4'-benzophenonetetracarboxylic dianhydride), TMA(trimellitic anhydride), and ODPA(4,4'-oxydiphthalic anhydride); and the substrate 202 may have a hydrophilic function group capable of improving adhesiveness through hydrogen bonding.

In this instance, the first line 210 and the second line 212 may also be made of the same substance as the substrate 202, thereby improving adhesiveness with respect to the substrate 202. This is because, when made of the same polymer substance, additional bonding or hydrogen bonding between function groups enables strong bonding.

Besides this, the substrate 202 of the OLED 200 and the polymer substance 182 need to be made of a substance having a low level of hardness to cope with folding or bending.

Meanwhile, when the OLED 200 adopts a bottom emission scheme, the second electrode 236 may be made of the above-mentioned conductor 180. As used herein, the bottom emission scheme refers to a scheme in which light emitted from the organic layer 234 is reflected by the second electrode 236 and discharged outwards in the direction of the first electrode 230.

Figure 4:
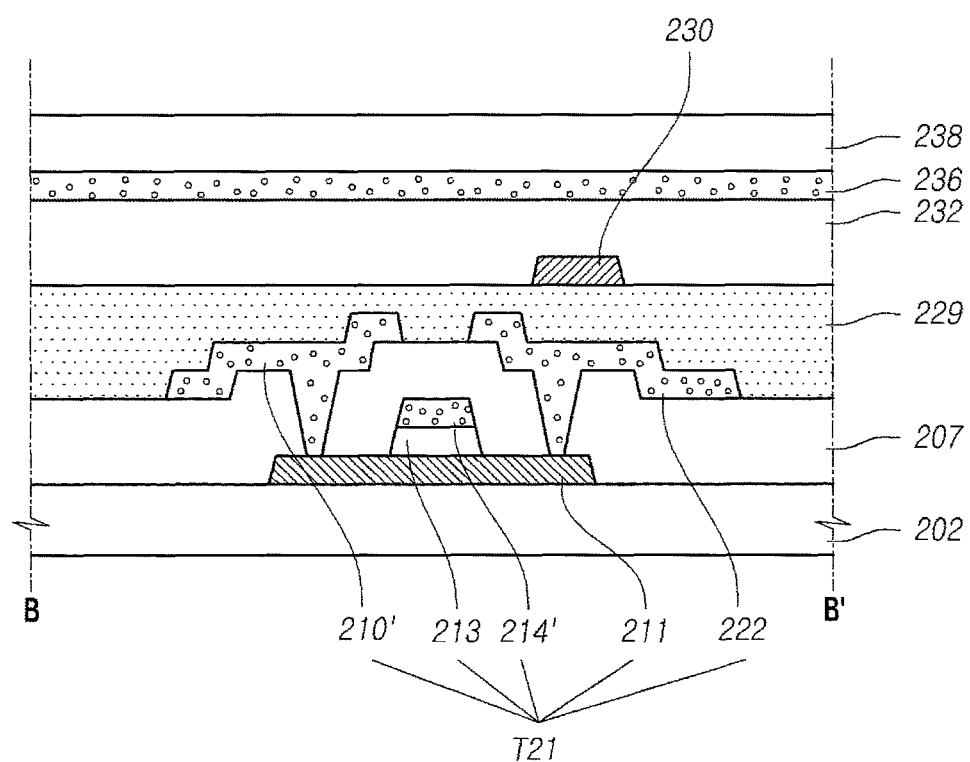
FIG. 4 is a sectional view taken along B-B' of the flexible OLED according to an embodiment of the invention of FIG. 2.

FIG. 4 is a sectional view taken along B-B' of the flexible OLED of FIG. 2.

Referring to FIG. 4, the flexible OLED 200 may include a first transistor T21 formed on a substrate 202, a first insulation film 229 formed on the first transistor T21, and a first electrode 230, a bank 232, a second electrode 236, and a protection layer 238, which are successively formed on the first insulation film 229.

The first transistor T21 may include a first semiconductor layer 211, a gate insulation film 213, a first gate electrode 214', a first source electrode 210', a first drain electrode 222, and a second insulation film 207.

In this regard, the first transistor T21 may be an oxide transistor having a first semiconductor layer 211 made of an oxide semiconductor, such as IGZO(Indium Gallium Zinc Oxide), but embodiments of the invention are not limited thereto, and the first transistor T21 may be a transistor made of a LTPS (Low Temperature PolySilicon) semiconductor or a transistor made of an amorphous silicon semiconductor.

In addition, although the first transistor T21 has been illustrated in a top gate scheme, i.e. the first gate electrode 214' is positioned on the first semiconductor layer 211, embodiments of the invention are not limited thereto, and a bottom gate scheme may also be adopted.

Meanwhile, the gate insulation film 213 and the second insulation film 207 may be organic films or inorganic films such as silicon oxide (SiOx) or silicon nitride (SiNx).

In this instance, at least one of the first gate electrode 214', the first source electrode 210', and the first drain electrode 222, which are formed on the insulation films 213, 207 positioned on the substrate 202, may be made of a conductor 180; the polymer substance 182 of the first gate electrode 214', the first source electrode 210', and the first drain electrode 222 may be made of the same substance as that of the insulation films 213, 207 and, for example, may be made of a polyimide-based substance. This can advantageously improve adhesiveness through additional bonding or hydrogen bonding between function groups, as described above.

This advantageously increases adhesiveness between the conductor 180 and the insulation films 213, 207. In addition, the fact that the metal nanowire structure 184 is inserted into and firmly coupled to the polymer substance 182 advantageously improves electric conductivity, surface uniformity, reliability regarding fatigue fracture resulting from bending and folding, durability, and the like.

Having described the structure of the conductor 180 and the display device 200, to which the conductor 180 is applied, a method of manufacturing a flexible display device 200 including the conductor 180 will now be described.

FIG. 5A to FIG. 5E schematically illustrate a method of manufacturing a conductor formed on a flexible display device according to another embodiment of the invention. The drawings are solely for convenience of description and do not limit embodiments of the invention, and various methods or processes may be used to manufacture the conductor.

Referring to FIG. 5A to FIG. 5E, a method of manufacturing a flexible display device 200 may include the operation of: forming a polymer substance 582 having adhesiveness on a substrate or on an insulation film 570 positioned on the substrate; applying multiple metal nanowires 583 onto the polymer substance 582; and forming a conductor 580, which has a metal nanowire structure 584 inserted into the polymer substance 582, by cross-connecting the multiple metal nanowires 583 to form a metal nanowire structure 584 and insert it into the polymer substance 582. The metal nanowire structure 584 may be, for example, a silver nanowire structure.

Figure 5A:
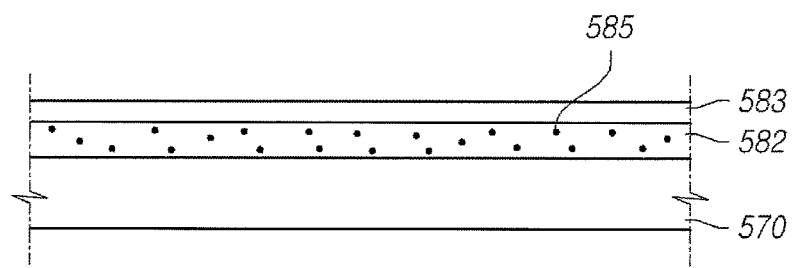
FIG. 5A to FIG. 5E schematically illustrate a method of manufacturing a conductor formed on a flexible display device according to another embodiment of the invention.

As illustrated in FIG. 5A, a step of forming a polymer substance 582 and multiple metal nanowires 583 successively on a substrate or an insulation film 570 (hereinafter, referred to as a base layer) is performed.

The base layer 570 may be a lower substrate of the flexible display device 200, and the insulation film 570 may be an insulation film formed on the substrate or a gate insulation film formed on a gate of a transistor.

The polymer substance 582 having adhesiveness may be a substance capable of improving adhesiveness with respect to the base layer 570 or adhesiveness with respect to the metal nanowire structure 584. For example, the substance may include polyimide-based polymer. In addition, such polyimide-based polymer may have a hydrophilic function group that improves adhesiveness through hydrogen bonding. In this instance, the polymer substance 582 and the base layer 570 may be made of the same substance.

Meanwhile, the polymer substance 582 may include a photosensitive substance, which may be a photo acryl-based substance, for example, but is not limited thereto. This will be described later in more detail.

The metal nanowires 583 may be pre-processed with an anti-corrosive agent before/after coating or deposition onto the base layer 570. For example, the metal nanowires 583 may be pre-coated with barrier-forming anti-corrosive agents, such as BTA and dithiothiadiazole. Furthermore, the metal nanowires 583 may be processed with an anti-tarnish solution.

The viscosity, corrosiveness, adhesiveness, and dispersiveness of the metal nanowires 583 may be adjusted by additives and binders. Suitable additives and binders may include, for example, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), xanthan gum (XG), ethoxylates, alkoxylate, ethylene oxide, propylene oxide, and copolymers thereof.

Schemes of applying the metal nanowires 583 may include spin coating, nozzle coating, slit coating, and printing, and deposition schemes may include chemical vapor deposition and physical vapor deposition, but the schemes are not limited thereto.

Figure 5B:
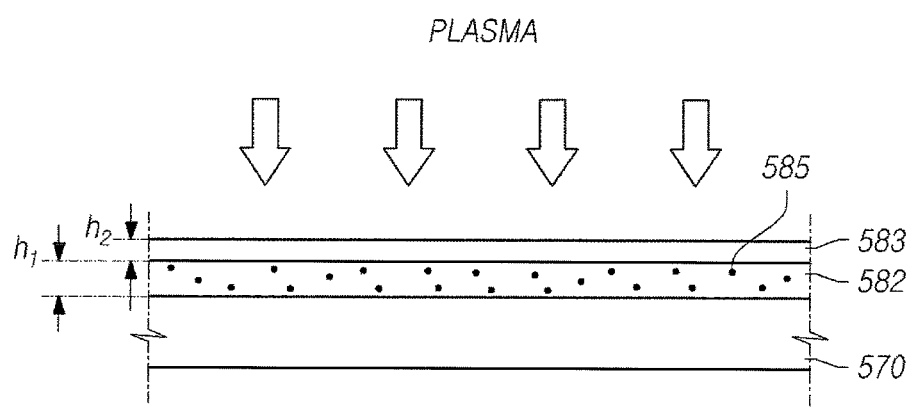
Figure 5C:
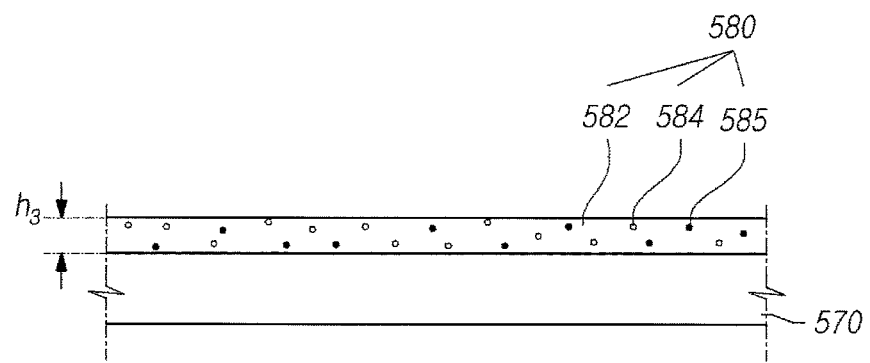

Meanwhile, a step of forming a conductor 580, which has a metal nanowire structure 584 inserted into a polymer substance 582, by subjecting metal nanowires 583 to plasma treatment is illustrated in FIG. 5B and FIG. 5C.

The step of forming a conductor 580 may be performed by one of pressurization, plasma treatment, light sintering-type welding treatment, and heating-type welding treatment, and is not limited thereto.

The plasma treatment scheme may be one of thermal plasma, cold plasma, which is a type of glow discharge occurring under various gases with removed pressure, and hybrid plasma, and may be, for example, cold plasma treatment conducted under an oxygen gas condition.

The light sintering scheme can instantly deliver a high level of light energy at about 1500° C. within a very short period of time of 20 ms. In addition, use of transparent light of visible rays does not damage the transparent substrate at all, thereby avoiding any influence on the upper layers of the metal nanowires 583 and the underlying base layer 570.

On the other hand, the heating scheme, which relies on electricity, is as follows: when a predetermined voltage is applied, the resulting Joule heating generates heat, which welds the metal nanowires 583; the amount of generated heat is in proportion to the square of current and is in proportion to the size of resistance.

A display device, such as a flexible display or a folding display, may be repeatedly bent or folded. As a result, the metal nanowire structure 584 may be broken, but can be reconnected by the heating scheme using electricity. In other words, the heating-type welding is advantageous in that broken parts of the metal nanowire structure 584 can be joined again by heat generated when a voltage is applied to the display device and drives it.

On the other hand, the metal nanowires 583 can be welded by the above-mentioned plasma treatment or heating treatment, for example, and simultaneously inserted into the polymer substance 582. In other words, a metal nanowire structure 584 is formed and simultaneously inserted, thereby forming a conductor 580.

Figure 5D:
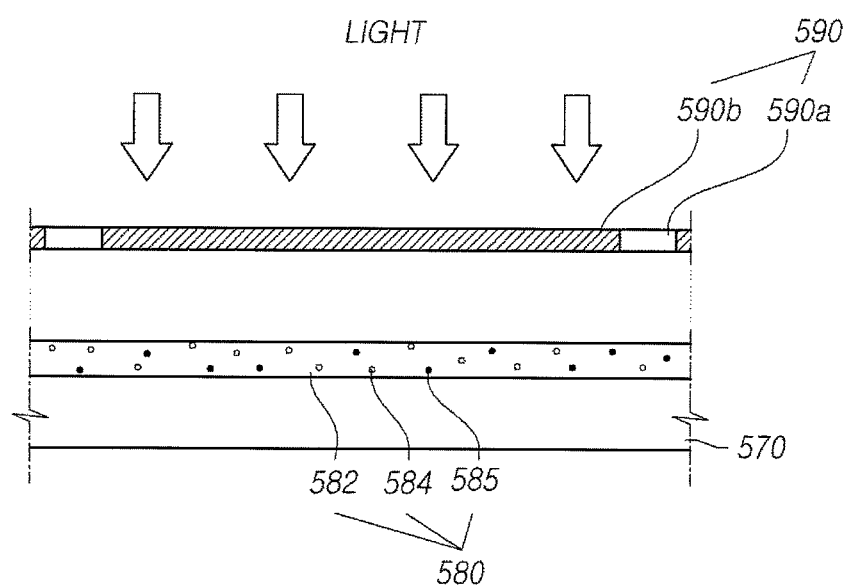
Figure 5E:
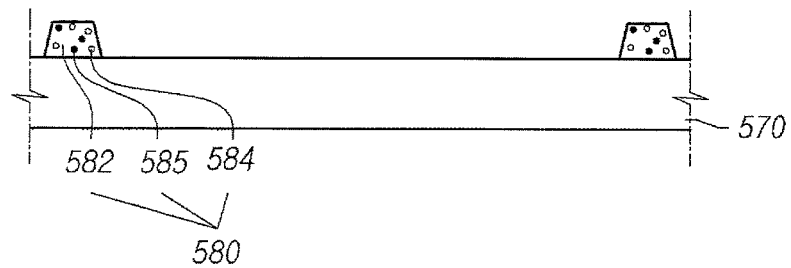

Thereafter, a step of patterning the formed conductor 580 is illustrated in FIG. 5D and FIG. 5E.

The method of manufacturing a flexible display device 200 may further include a step of patterning the conductor 580 by using a mask 590 to conduct exposure and development treatments, after the operation of forming a conductor 580, when, in the operation of forming a polymer substance 582, the polymer substance 582 is formed by mixing a photosensitive substance 585 with it.

Specifically, the polymer substance 582 may be mixed with a photosensitive substance 585 and formed on the base layer 570. As used herein, the photosensitive substance 585 refers to a substance, the solubility of which varies inside a developer when a specific wavelength of light is received, so that exposed parts or the other parts can be selectively removed during the following development process. For example, the photosensitive substance may be a photo acryl-based substance, but is not limited thereto.

Although the exposure process illustrated in FIG. 5D adopts a negative type, in which unexposed parts are removed by the developer, embodiments of the invention are not limited thereto and may also adopt the positive type, in which the exposed parts are removed.

Referring to FIG. 5D, a step of radiating light using an exposure mask 590, which has a transmission portion 590a and a shielding part 590b, is performed. Although not illustrated, a PEB (post exposure bake) process may be performed after the exposure step.

Thereafter, a development process may be performed using a developer composed of a water-soluble alkali solution, e.g. potassium hydroxide (KOH), and a TMAH (TetraMethyl-Ammonium-Hydroxide) aqueous solution to pattern a conductor 580, such as the first to fifth lines 210, 212, 214, 216, 218, the first to third gate electrodes 214', 216, 228, the first to third source electrodes 210', 226, 212', and the first to third drain electrodes 222, 225 illustrated in FIG. 2.

According to such a patterning scheme, a photosensitive substance 585 is mixed with a polymer substance 582 and applied onto the base layer 570, so that the operation of applying a photoresist layer and the process of stripping the photoresist layer that remains after the development process can be omitted, thereby making processes simpler, improving the yield ratio, and reducing the manufacturing cost.

Figure 6:
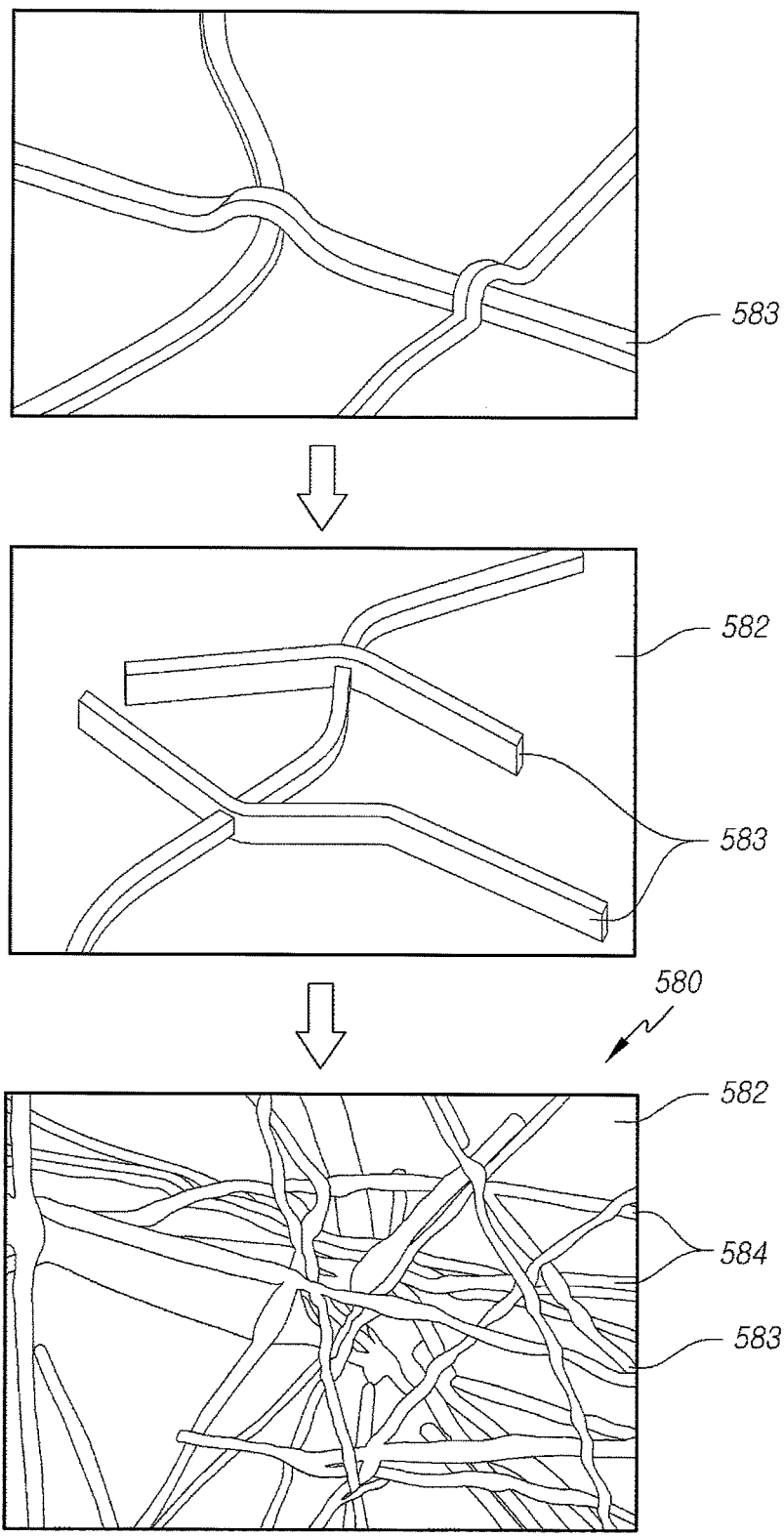
FIG. 6 illustrates schematic top views of a process for forming a metal nanowire structure of a flexible display device according to another embodiment of the invention.

FIG. 6 illustrates schematic top views of a process for forming a metal nanowire structure of a flexible display device according to another embodiment of the invention.

The metal nanowire structure 584 can be formed by welding multiple separate metal nanowires 583 to each other. In embodiments of the invention, the metal nanowire structure 584 can be formed by cross-connecting or cross-linking the multiple separate metal nanowires 583 to each other. As described above, one of pressurization, plasma treatment, light sintering-type welding treatment, and heating-type welding treatment may be adopted to enable the cross-connecting or cross-linking. In embodiments of the invention, application of heat to the multiple separate metal nanowires 583 and/or the polymer substance 582. Thus, the metal nanowire structure 584 are disposed in the polymer substance 582 by being enveloped therein. Also, In addition, the metal nanowire structure 584 may be a silver nanowire structure or may contain silver, but is not limited thereto. Other metals or material may be used for the nanowire structure.

Furthermore, the metal nanowire structure 584 has multiple metal nanowires 583 coupled randomly. A metal nanowire 583 may be connected, at at least one part thereof, to another nanowire 583; or one nanowire 583 may be connected to a number of other nanowires 583. In embodiments of the invention, the metal nanowires 583 may be formed into a mesh-sheet or a mesh prior to being formed into the metal nanowire structure 584. If the metal nanowires 583 are the mesh, one or more sheets of the mesh may be used. Strands of the metal nonowire 583 may intersect, may be parallel, or both. Such intersection and/or parallel arrangement may be regular or irregular. Additionally, the metal nanowires 583 may be formed into a tube or other geometric shapes when in the mesh or sheet form. Also, each strand of the metal nanowires 583 need not be in the form of a wire having a circular cross section, but may have other shapes, or may have irregular shapes along their lengths.

Therefore, in connection with the flexible display device 200, the metal nanowire structure 584 may be used as wiring or electrodes, based on electric conductivity of the metal. Furthermore, the random coupling type can secure strong coupling force in instance of repeated bending or folding. In addition, the electric conductivity can be advantageously maintained even when a part of the metal nanowire structure 584 is broken.

Figure 7A:
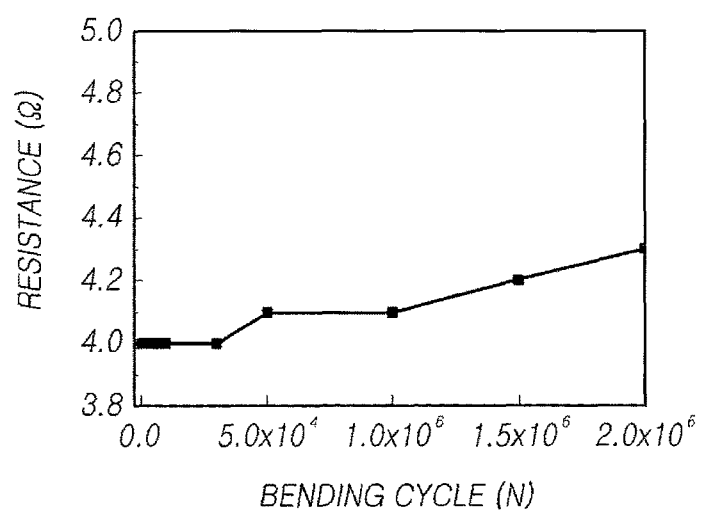
FIG. 7A is a graph illustrating a relationship between resistance and a bending cycle in connection with a flexible display device according to another embodiment of the invention.

FIG. 7A is a graph illustrating a relationship between resistance and bending cycle in connection with a flexible display device according to another embodiment of the invention, and FIG. 7B is a table corresponding to the graph of FIG. 7A.

FIG. 7A and FIG. 7B illustrate results of a bending test when the radius of curvature (R) is 4.5, and the ratio of deformation caused by external force, i.e. strain, is 1.5%. In this regard, the resistance refers to line resistance; the initial resistance value is 4.0Ω; the resistance value after bending at 50,000 cycles is 4.1Ω; in the instance of 100,000 cycles, 4.1Ω; and, in the instance of 200,000 cycles, 4.2Ω. The ratio of increase of the resistance value is only 5% over 200,000 times of bending.

The above-mentioned strain ε (unit: %) is defined by equation (1) below. The radius of curvature (R) refers to the radius of curvature during bending, $d_1$ refers to the thickness of the substrate 202 of the flexible display device 200, and $d_2$ refers to the thickness of the conductor 180, 580 formed on the substrate 202.

$$\varepsilon = \left(\frac{d_1 + d_2}{2R}\right) \times 100 \quad (1)$$

It is clear from the test results that the flexible display device according to embodiments of the invention have reliability against environments of repeated bending and folding.

In other words, the metal nanowire structure 184, 584, which is formed by multiple metal nanowires 583 intersecting with each other, has multiple random welding points so that the metal nanowire structure 184, 584 can secure strong coupling force and stability.

Therefore, even when a part of the metal nanowire structure 184, 584 is broken or has a defect, the multiple connections still improve the reliability of the flexible display device 200. Furthermore, when a voltage is applied to the flexible display device 200, broken parts of the metal nanowire structure 184, 584 can be advantageously welded again by Joule heating.

In addition, since the metal nanowire structure 184, 584 is inserted into a polymer substance 182, 582 and thereby forms a conductor 180, 580, strong coupling between the metal nanowire structure 184, 584 and the polymer substance 182, 582 can be maintained. This improves reliability of the flexible display device 200 against fatigue fracture.

In summary, the metal nanowire structure 184, 584 itself has reliability or stability against fatigue fracture, and the conductor 180, 580 is integrally formed by inserting the metal nanowire structure 184, 584 into a polymer substance 182, 582, so that the ratio of increase of resistance is only 5% through 200,000 times of bending tests.

Advantageous effects of a flexible display device 200, to which the above-described embodiments of the invention are applied, are as follows: first, adhesiveness between the metal nanowire structure 184, 584 and the polymer substance 182, 582 is improved, and adhesiveness between the polymer substance 182, 582 and the lower layer (i.e. substrate) or the insulation film 570 can also be improved.

Furthermore, the insertion of the metal nanowire structure 184, 584 into the polymer substance 182, 582 not only gives the conductor 180, 580 strong coupling force, but also reduces the sheet resistance. In other words, signal lines or electrodes using silver nanowires generally have a problem of high sheet resistance, but the conductor 180, 580 according to embodiments of the invention can have a low sheet resistance value of 1Ω/□ or less, for example, 0.4Ω/□ to 0.6Ω/□.

Furthermore, the structure of the conductor 180, 580 can also reduce the thickness, thereby reducing the panel thickness of the flexible display device 200.

On the other hand, the flexible display device 200, which includes a conductor 180, 580, can secure a high level of electric conductivity due to the high level of electric conductivity of the metal nanowire structure 184, 584, e.g. silver nanowire structure.

In general, in the instance of a signal line or an electrode using silver nanowires, the uneven surface may pose a problem. In other words, since the nanowires make the surface uneven, electric characteristics of the flexible display device 200 may change, depending on the surface condition, or a defect may occur.

However, the conductor 180, 580 according to embodiments of the invention has a metal nanowire structure 184, 584, which is a conductive substance, inserted into a polymer substance 182, 582, so that the surface uniformity can be improved, thereby making it unnecessary to form a separate layer for flattening the surface.

Finally, the conductor 180, 580 may include a photosensitive substance 585, so that it can be patterned solely by an exposure process using a mask and a development process using a developer. Therefore, the process of applying a photoresist, the etching process after development, and the process of stripping the photoresist can be omitted, thereby advantageously reducing the number of processes, decreasing the manufacturing costs, and improving the yield ratio.

Although various embodiments of the invention have been described up to now with reference to the accompanying drawings, the embodiment of the invention are not limited to them.

Further, the terms "includes", "constitutes", or "has" mentioned above mean that a corresponding structural element is included unless context dictates otherwise. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the disclosure expressly defines them so.

Although the embodiments of the invention have been described for illustrative purposes, those skilled in the art will appreciate that various modifications, additions and substitutions are possible, without departing from the scope and spirit of the invention. Accordingly, the embodiments disclosed in the invention are merely to not limit but describe the technical spirit of the embodiments of the invention. Further, the scope of the technical spirit of the invention is limited by the embodiments of the invention. The scope of the embodiments of the invention shall be construed on the basis of the accompanying claims in such a manner that all of the technical ideas included within the scope equivalent to the claims belong to the embodiments of the invention.

What is claimed is:

1. A flexible display device comprising:
    a substrate having a plurality of signal lines arranged on the substrate;
    an insulation film on the substrate;
    a transistor on the substrate, the transistor having a gate electrode, a source electrode, and a drain electrode; and
    a second electrode disposed over a first electrode, the first electrode being connected to the source electrode or the drain electrode of the transistor,
    wherein at least one of the plurality of signal lines, the source electrode, and the drain electrode includes a conductor,
    wherein the conductor includes a metal nanowire structure, a polymer substance, and a photosensitive substance, the polymer substance having a hydrophilic function group that improves adhesiveness through hydrogen bonding, and the photosensitive substance being mixed in with the polymer substance,
    wherein the metal nanowire structure is a plurality of sheets of mesh formed of a plurality of metal nanowires in which the plurality of metal nanowires are welded and coupled randomly, wherein a ratio of increase of a resistance value in the flexible display device is about 5% over 200,000 times of bending,
wherein the insulation film includes the polymer substance having the hydrophilic function group,
wherein the insulation film and the conductor are in direct contact, and
wherein adhesiveness between the insulation film and the conductor is improved through additional bonding or hydrogen bonding between the hydrophilic function group of the polymer substance of the insulation film and the hydrophilic function group of the polymer substance of the conductor.

2. The flexible display device of claim 1, wherein the metal nanowire structure has the plurality of metal nanowires cross-connected to each other.

3. The flexible display device of claim 1, wherein the metal nanowire structure includes silver.

4. The flexible display device of claim 1, wherein the polymer substance is a polyimide-based substance.

5. The flexible display device of claim 1, wherein the photosensitive substance is a photo acryl-based substance.

6. The flexible display device of claim 1, further comprising:
an organic layer between the first and second electrodes.

7. The flexible display device of claim 1, wherein the metal nanowire structure is coated with a barrier-forming anti-corrosive agent.

8. The flexible display device of claim 7, wherein the barrier-forming anti-corrosive agent includes one of benzotriazole (BTA) and dithiothiadiazole.

9. The flexible display device of claim 1, wherein a strain (E) in the flexible display device is defined by equation (1):

$$\varepsilon = \left(\frac{d_1 + d_2}{2R}\right) \times 100, \qquad \text{equation (1)}$$

wherein R is a radius of curvature during bending of the flexible display device, d1 is a thickness of the substrate, and d2 is a thickness of the conductor.

10. A flexible display device comprising:
a substrate;
an insulation film on the substrate; and
a conductor on the substrate, the conductor including a metal nanowire structure, a polymer substance, and a photosensitive substance, the polymer substance having a hydrophilic function group that improves adhesiveness through hydrogen bonding, and the photosensitive substance being mixed in with the polymer substance,
wherein the substrate includes the polymer substance, and
wherein the metal nanowire structure is a plurality of sheets of mesh formed of a plurality of metal nanowires in which the plurality of metal nanowires are welded and coupled randomly,
wherein a ratio of increase of a resistance value in the flexible display device is about 5% over 200,000 times of bending,
wherein the insulation film includes the polymer substance having the hydrophilic function group,
wherein the insulation film and the conductor are in direct contact, and
wherein adhesiveness between the insulation film and the conductor is improved through additional bonding or hydrogen bonding between the hydrophilic function group of the polymer substance of the insulation film and the hydrophilic function group of the polymer substance of the conductor.

11. The flexible display device of claim 10, wherein the conductor is at least one of a source electrode, a drain electrode, and a gate electrode of a transistor of the flexible display device, and a signal line and a common electrode of the flexible display device.

12. The flexible display device of claim 11, further comprising:
a first electrode connected with the source electrode;
a second electrode disposed over the first electrode; and
an organic layer between the first and second electrodes.

13. The flexible display device of claim 11, wherein the gate electrode, the source electrode, and the drain electrode are disposed on an insulation film positioned on the substrate, and the insulation film includes the polymer substance of the at least one of the gate electrode, the source electrode, and the drain electrode.

14. The flexible display device of claim 10, wherein the conductor is a signal line on the substrate or a common electrode disposed on the substrate.

15. The flexible display device of claim 10, wherein the metal nanowire structure has the plurality of metal nanowires cross-connected to each other.

16. The flexible display device of claim 10, wherein the metal nanowire structure includes silver.

17. The flexible display device of claim 10, wherein the polymer substance is a polyimide-based substance.

18. The flexible display device of claim 10, wherein the metal nanowire structure is coated with a barrier-forming anti-corrosive agent.

19. The flexible display device of claim 18, wherein the barrier-forming anti-corrosive agent includes one of benzotriazole (BTA) and dithiothiadiazole.

20. The flexible display device of claim 10, wherein a strain (ε) in the flexible display device is defined by equation (1):

$$\varepsilon = \left(\frac{d_1 + d_2}{2R}\right) \times 100, \qquad \text{equation (1)}$$

wherein R is a radius of curvature during bending of the flexible display device, d1 is a thickness of the substrate, and d2 is a thickness of the conductor.

* * * * *